(12) United States Patent
Nakamura

(10) Patent No.: US 11,364,573 B2
(45) Date of Patent: Jun. 21, 2022

(54) LASER PROCESSING APPARATUS INCLUDING IMAGER OF MARK OF PROCESSED WORKPIECE

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 232 days.

(21) Appl. No.: 16/936,631

(22) Filed: Jul. 23, 2020

(65) Prior Publication Data

US 2021/0031307 A1 Feb. 4, 2021

(30) Foreign Application Priority Data

Jul. 31, 2019 (JP) .............................. JP2019-141077

(51) Int. Cl.
| | |
|---|---|
| *B23K 26/50* | (2014.01) |
| *B23K 26/08* | (2014.01) |
| *H01L 21/304* | (2006.01) |
| *H01L 21/68* | (2006.01) |
| *H01L 23/544* | (2006.01) |

(Continued)

(52) U.S. Cl.
CPC .............. *B23K 26/50* (2015.10); *B23K 26/08* (2013.01); *H01L 21/304* (2013.01); *H01L 21/68* (2013.01); *H01L 21/78* (2013.01); *H01L 23/544* (2013.01); *B23K 2101/40* (2018.08)

(58) Field of Classification Search
CPC .... B23K 26/50; B23K 26/08; B23K 2101/40; B23K 26/02; B23K 26/53; B23K 26/702; B23K 26/0853; B23K 26/38; H01L 21/304; H01L 21/68; H01L 21/78; H01L 23/544; H01L 2221/68327; H01L 2221/6834; H01L 2223/54493; H01L 21/67253; H01L 21/681; H01L 21/6836; H01L 21/67092; H01L 21/3043; B28D 5/00

See application file for complete search history.

(56) References Cited

U.S. PATENT DOCUMENTS

| | | | |
|---|---|---|---|
| 2014/0120716 A1* | 5/2014 | Sakaguchi | ........ H01L 29/66333 438/652 |
| 2017/0301571 A1* | 10/2017 | Tsuchiya | ........... H01L 21/67115 |
| 2018/0161920 A1 | 6/2018 | Nomura et al. | |

(Continued)

FOREIGN PATENT DOCUMENTS

JP 2002192370 A 7/2002

OTHER PUBLICATIONS

Search report issued in counterpart Singapore patent application No. 10202006742U, dated Aug. 4, 2021.

*Primary Examiner* — John P. Dulka
(74) *Attorney, Agent, or Firm* — Greer Burns & Crain Ltd.

(57) ABSTRACT

A laser processing apparatus includes an unloading/loading mechanism for unloading a wafer from and loading a wafer into a cassette placed on a cassette placing stand, a chuck table for rotatably holding the wafer unloaded from the cassette by the unloading/loading mechanism, an image capturing unit for capturing an image of a wafer, and a control unit. The control unit controls the unloading/loading mechanism to orient a mark indicating the crystal orientation of a processed wafer in a predetermined direction different from a direction in which the mark of an unprocessed wafer in the cassette is oriented, when the unloading/loading mechanism houses the processed wafer into the cassette.

3 Claims, 4 Drawing Sheets

(51) Int. Cl.
*H01L 21/78* (2006.01)
*B23K 101/40* (2006.01)

(56) References Cited

U.S. PATENT DOCUMENTS

2018/0374729 A1* 12/2018 Zhou ................ H01L 21/67253
2022/0032404 A1* 2/2022 Sekiya .................. B23K 26/53

* cited by examiner

LASER PROCESSING APPARATUS INCLUDING IMAGER OF MARK OF PROCESSED WORKPIECE

BACKGROUND OF THE INVENTION

Field of the Invention

The present invention relates to a laser processing apparatus for processing, with a laser beam, a wafer having a plurality of devices that are formed in respective areas on a face side thereof and that are demarcated by a plurality of intersecting projected dicing lines.

Description of the Related Art

Wafers with a plurality of devices, such as integrated circuits (ICs), large scale integration (LSI) circuits, etc., that are formed in respective areas on a face side thereof and that are demarcated by a plurality of intersecting projected dicing lines are divided into individual device chips by a dicing apparatus or a laser processing apparatus. The divided device chips will be used in electronic appliances including mobile phones and personal computers.

The laser processing apparatus includes a chuck table for holding a wafer thereon, a laser beam applying unit for applying a laser beam having a wavelength that is transmittable through the wafer held on the chuck table to the wafer while positioning a focused spot of the laser beam within the wafer below projected dicing lines to thereby form modified layers that will act as division initiating points in the wafer, a feed mechanism for processing-feeding the chuck table and the laser beam applying unit relatively to each other, an image capturing unit for capturing an image of the wafer, and a control unit. The laser processing apparatus is able to divide the wafer into device chips with high accuracy (see, for example, Japanese Patent No. 3408805).

SUMMARY OF THE INVENTION

In a case where the modified layers are formed within the wafer by the laser beam whose focused spot is positioned within the wafer below the projected dicing lines, the presence of the modified layers cannot easily be confirmed with the naked eye, and whether or not the wafer has been processed cannot be determined. As a result, even if a wafer housed in a cassette has already been processed, the cassette may be set on the laser processing apparatus for some reason, and the processed wafer housed in the cassette may be processed again with a laser beam. If the laser beam is applied again to the processed wafer with modified layers formed therein below projected dicing lines thereon, the laser beam is irregularly reflected by the already formed modified layers, tending to damage devices on the wafer and cause a large loss.

It is therefore an object of the present invention to provide a laser processing apparatus that will not process again, with a laser beam, a wafer that has already been processed.

In accordance with an aspect of the present invention, there is provided a laser processing apparatus for processing, with a laser beam, a wafer having a plurality of devices that are formed in respective areas on a face side thereof and that are demarcated by a plurality of intersecting projected dicing lines, the laser processing apparatus including a cassette placing stand for placing thereon a cassette housing a plurality of wafers, an unloading/loading mechanism for unloading a wafer from and loading a wafer into the cassette placed on the cassette placing stand, a chuck table for rotatably holding the wafer unloaded from the cassette by the unloading/loading mechanism, a laser beam applying unit for applying a laser beam having a wavelength that is transmittable through the wafer held on the chuck table to the wafer while positioning a focused spot of the laser beam within the wafer below projected dicing lines to thereby form modified layers that will act as division initiating points in the wafer, a feed mechanism for processing-feeding the chuck table and the laser beam applying unit relatively to each other, an image capturing unit for capturing an image of the wafer, and a control unit for controlling the unloading/loading mechanism to orient a mark indicating a crystal orientation of a wafer processed by the laser beam applying unit in a predetermined direction different from a direction in which the mark of an unprocessed wafer in the cassette is oriented, when the unloading/loading mechanism houses the processed wafer into the cassette.

Preferably, the control unit includes a decision section for deciding that, in a case where a mark indicating the crystal orientation of a wafer unloaded from the cassette by the unloading/loading mechanism is oriented in a first direction on the basis of an image of the wafer captured by the image capturing unit, the wafer is an unprocessed wafer, and in a case where the mark is oriented in a second direction different from the first direction, the wafer is a processed wafer. Preferably, the decision section issues warnings when the decision section decides that the wafer is a processed wafer.

According to the present invention, inasmuch as the control unit controls the unloading/loading mechanism to orient the mark indicating the crystal orientation of the wafer processed by the laser beam applying unit in a predetermined direction different from the direction in which the mark of an unprocessed wafer in the cassette is oriented when the unloading/loading mechanism houses the processed wafer into the cassette, the processed wafer will not be processed again by the laser processing apparatus and the devices on the processed wafer will thus be prevented from being damaged by the laser beam irregularly reflected by the already formed modified layers.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
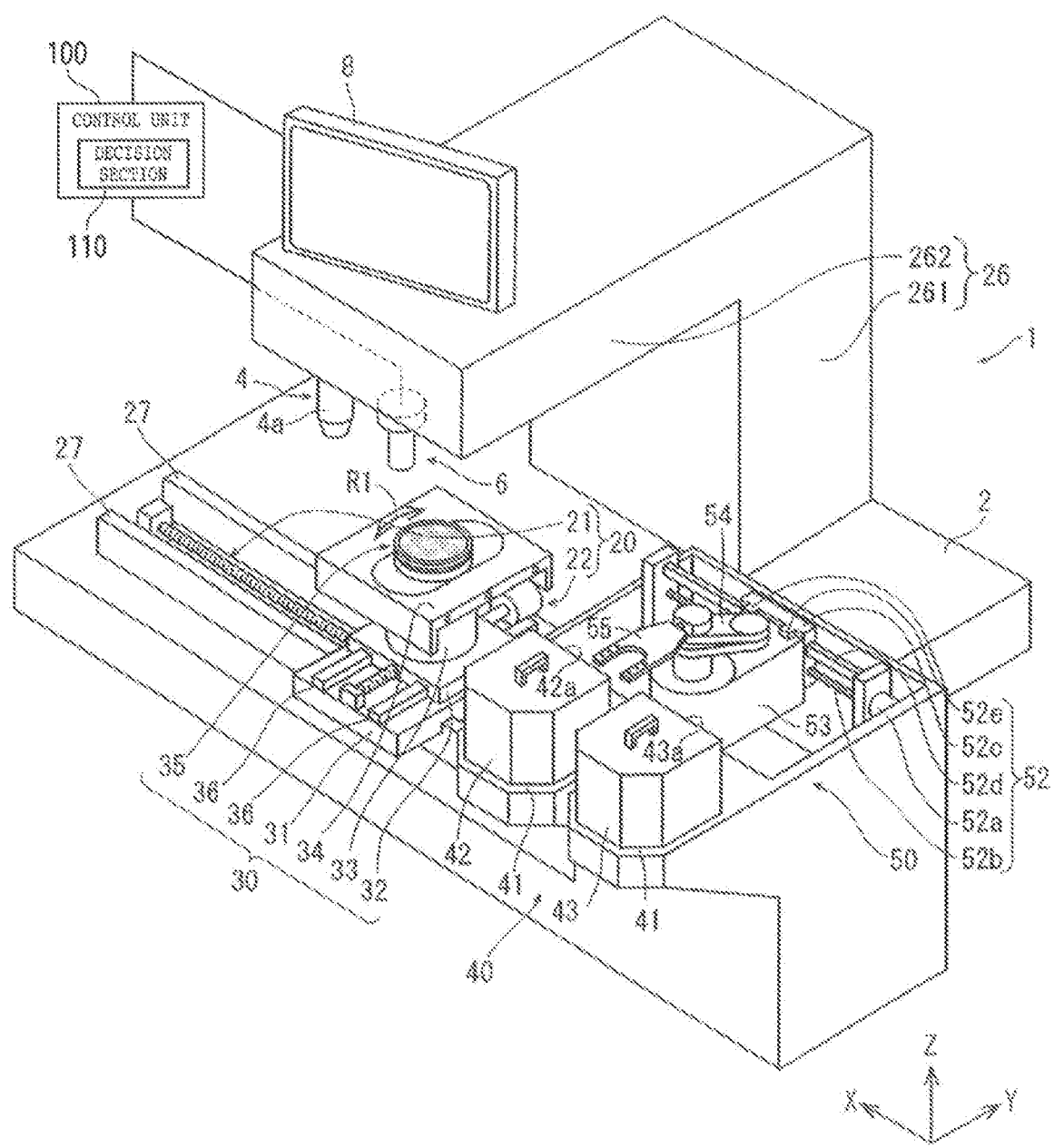
FIG. 1 is a perspective view illustrating a laser processing apparatus according to an embodiment of the present invention in its entirety.

A laser processing apparatus according to a preferred embodiment of the present invention will hereinafter be described in detail with reference to the accompanying drawings. FIG. 1 illustrates in perspective the laser processing apparatus, denoted by 1, according to the present embodiment, in its entirety. As illustrated in FIG. 1, the laser processing apparatus 1 includes a base 2, a laser beam applying unit 4 disposed on the base 2 as a processing unit for applying a laser beam to a wafer as a workpiece, a holding unit 30 for holding the wafer thereon, an image capturing unit 6 for capturing an image of the wafer held on the holding unit 30, a feed mechanism 20 for processing-feeding the laser beam applying unit 4 and the holding unit 30 relatively to each other and moving the image capturing unit 6 and the holding unit 30 relatively to each other, a frame body 26 having a vertical wall 261 erected on a rear side of the base 2 and a horizontal wall 262 extending horizontally from an upper end portion of the vertical wall 261, a cassette placing mechanism 40 and an unloading/loading mechanism 50 that are disposed on the base 2 adjacent to the feed mechanism 20, and a control unit 100 for controlling the operating components of the laser processing apparatus 1.

The horizontal wall 262 of the frame body 26 houses therein an unillustrated optical system of the laser beam applying unit 4. The laser beam applying unit 4 includes, in addition to the optical system, a laser oscillator and an output adjusting unit, that are not illustrated, and a beam condenser 4a disposed on a lower surface of a distal end portion of the horizontal wall 262.

The image capturing unit 6 is disposed on the lower surface of the distal end portion of the horizontal wall 262 in a position adjacent to the beam condenser 4a of the laser beam applying unit 4 in an X-axis direction indicated by the arrow X in FIG. 1. The horizontal wall 262 supports thereon a display unit 8 electrically connected to the control unit 100 and having a touch panel function for displaying laser processing conditions for the laser processing apparatus 1 and allowing the operator to enter laser processing conditions.

The control unit 100 is implemented by a computer and includes a central processing unit (CPU) for performing arithmetic processing operations according to control programs, a read only memory (ROM) for storing the control programs, etc., a read-write random access memory (RAM) for temporarily storing images captured by the image capturing unit 6, detected values, processed results, etc., an input interface, and an output interface. Details of these components of the control unit 100 are omitted from illustration as they are well known in the art. The control unit 100 also includes a decision section 110 for controlling the components of the laser processing apparatus 1, recording appropriate information including images captured by the image capturing unit 6, analyzing the images captured by the image capturing unit 6, and deciding whether or not a wafer is unprocessed or has been processed, for example. Details of the decision section 110 will be described later. In FIG. 1, the control unit 100 is illustrated as being external to the laser processing apparatus 1 for illustrative purposes. Actually, the control unit 100 is housed in the laser processing apparatus 1.

As illustrated in FIG. 1, the holding unit 30 includes a rectangular X-axis movable plate 31 movably mounted on the base 2 for movement in the X-axis direction, a rectangular Y-axis movable plate 32 movably mounted on the X-axis movable plate 31 for movement in a Y-axis direction, indicated by the arrow Y and perpendicular to the X-axis direction, a hollow cylindrical support post 33 fixedly mounted on an upper surface of the Y-axis movable plate 32, and a rectangular cover plate 34 fixedly mounted on the upper end of the support post 33. A chuck table 35 is disposed on the cover plate 34 and extends upwardly through an oblong hole defined in the cover plate 34. The chuck table 35 that is arranged to support a circular wafer thereon is rotatable about its central axis in directions indicated by the arrow R1 by an unillustrated rotary actuator housed in the support post 33. The chuck table 35 has an upper surface made of an air-permeable porous material and functions as a holding surface extending substantially horizontally. The chuck table 35 is connected to unillustrated suction means through an unillustrated fluid channel extending through the support post 33.

The feed mechanism 20 includes an X-axis feed mechanism 21, a Y-axis feed mechanism 22, and the unillustrated rotary actuator housed in the support post 33. The X-axis feed mechanism 21 converts rotary motion of an unillustrated electric motor into linear motion through a ball screw and transmits the linear motion to the X-axis movable plate 31, moving the X-axis movable plate 31 in the X-axis direction and an opposite direction along a pair of guide rails 27 mounted on the base 2. The Y-axis feed mechanism 22, which is essentially similar to the X-axis feed mechanism 21, converts rotary motion of an unillustrated electric motor into linear motion through a ball screw and transmits the linear motion to the Y-axis movable plate 32, moving the Y-axis movable plate 32 in the Y-axis direction and an opposite direction along a pair of guide rails 36 mounted on the X-axis movable plate 31. The guide rails 27 on the base 2, the guide rails 36 on the X-axis movable plate 31, and the chuck table 35 are associated with respective scales and position detecting sensors such as reading means, for accurately detecting the positions of the chuck table 35 in the X-axis direction, the Y-axis direction, and a rotary direction. While the positions of the chuck table 35 are being thus detected, the feed mechanism 20 is actuated to move the chuck table 35 to a desired position with respect to the image capturing unit 6 and the beam condenser 4a of the laser beam applying unit 4.

The image capturing unit 6 includes an ordinary imaging device (charge coupled device (CCD)) for capturing images by using a visible light beam, infrared radiation applying means for applying infrared radiation to a wafer as a workpiece, an optical system for catching infrared radiation emitted from the infrared radiation applying means, and an infrared imaging device (infrared CCD) for outputting an electric signal representing the infrared radiation caught by the optical system. The image capturing unit 6 captures an image of a wafer held on the chuck table 35 of the holding unit 30, and the captured image is used by the control unit 100 in an alignment step for aligning a position to which the beam condenser 4a of the laser beam applying unit 4 is to apply a laser beam and an area of the wafer that is to be processed, with each other.

The cassette placing mechanism 40 according to the present embodiment includes a pair of cassette placing stands 41 for placing thereon a first cassette 42 and a second cassette 43, respectively, each cassette housing a plurality of wafers. The operator places the first cassette 42 and the second cassette 43, each housing unprocessed wafers therein, on the respective cassette placing stands 41 while directing the first cassette 42 and the second cassette 43 in a predetermined orientation. After the wafers housed in the first cassette 42 and the second cassette 43 have been unloaded and processed and the processed wafers have been housed again in the first cassette 42 and the second cassette 43, the first cassette 42 and the second cassette 43 are delivered from the respective cassette placing stands 41 to a suitable apparatus in a subsequent step of operation.

The unloading/loading mechanism 50 is disposed in a region facing an opening 42a in the first cassette 42 and an opening 43a in the second cassette 43. The unloading/loading mechanism 50 includes an actuating mechanism 52, an arm base 53, an arm mechanism 54 including a plurality of arms, and a robot hand 55 disposed on a distal end of the arm mechanism 54. The actuating mechanism 52 converts rotary motion of an electric motor 52a into linear motion through a ball screw 52b and transmits the linear motion to an unloading/loading movable plate 52c, moving the unloading/loading movable plate 52c along a guide rail 52d extending in the X-axis direction to position the unloading/loading movable plate 52c in a desired position in the X-axis direction. The unloading/loading movable plate 52c has a pair of vertical rails 52e disposed on a front surface thereof, and the arm base 53 is movably supported on the rails 52e for vertical movement therealong. Although not illustrated in detail, an electric motor and an actuating mechanism, for example, are operatively coupled between the unloading/loading movable plate 52c and the arm base 53. The actuating mechanism converts rotary motion of the electric motor into linear motion through a ball screw and transmits the linear motion to the arm base 53, moving the arm base 53 along the rails 52e in a Z-axis direction, i.e., a vertical direction, indicated by the arrow Z, to position the arm base 53 accurately in a desired position in the Z-axis direction.

The arm base 53 houses therein an unillustrated rotary actuator mechanism for actuating the arm mechanism 54 including the arms. The rotary actuator mechanism cooperates with respective electric motors, not illustrated, disposed on respective joints of the arms of the arm mechanism 54 in positioning the robot hand 55 that is U-shaped and is disposed on the distal end of the arm mechanism 54 in a desired position. The robot hand 55 has a plurality of suction holes defined therein that are supplied with a negative pressure through the arm mechanism 54 and the arm base 53. The actuating mechanism 52, the arm mechanism 54, and the robot hand 55 operate to attract and unload an unprocessed wafer from the first cassette 42 through the opening 42a thereof or the second cassette 43 through the opening 43a thereof, hold the unloaded wafer under suction, and deliver the wafer to an unloading/loading position where the chuck table 35 is positioned as illustrated in FIG. 1. The wafer that has been delivered to the unloading/loading position is placed on the chuck table 35 at a prescribed angle and is held under suction on the chuck table 35. The wafer held under suction on the chuck table 35 is turned a predetermined angle by the unillustrated rotary actuator housed in the support post 33. Thereafter, the wafer is positioned directly below the image capturing unit 6, and the alignment step is performed on the basis of an image of the wafer captured by the image capturing unit 6, positioning the wafer directly below the beam condenser 4a of the laser beam applying unit 4. Then, the wafer is processed by the laser beam applying unit 4.

After the wafer has been processed by the laser beam applying unit 4, the chuck table 35 is positioned again in the unloading/loading position illustrated in FIG. 1. The processed wafer is attracted under suction by the robot hand 55 of the unloading/loading mechanism 50, and then returned by the arm mechanism 54 and the robot hand 55 into the first cassette 42 or the second cassette 43 in which the wafer was housed prior to being processed.

Figure 2:
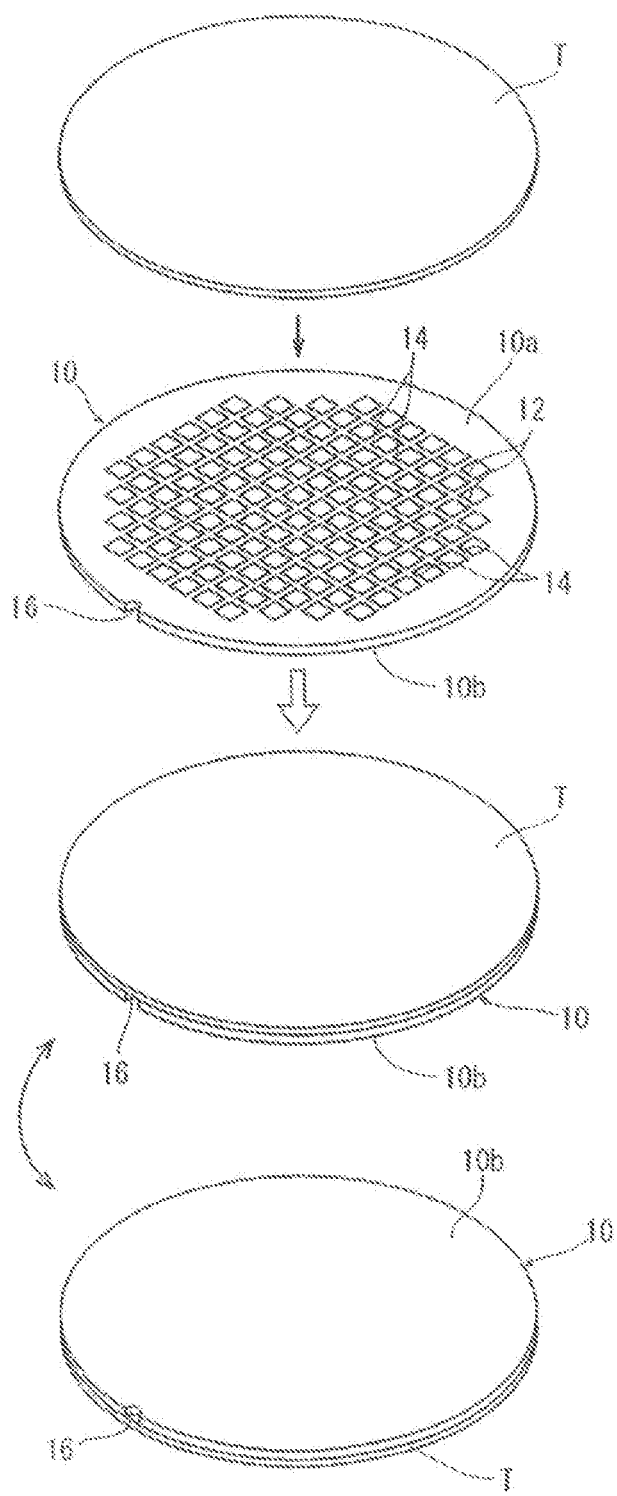
FIG. 2 is a perspective view of a wafer to be processed by the laser processing apparatus illustrated in FIG. 1 and a protective tape.

The laser processing apparatus 1 according to the present embodiment is constructed generally as described above. Operation of the laser processing apparatus 1 will be described below. FIG. 2 illustrates in perspective a wafer 10 to be processed by the laser processing apparatus 1. As illustrated in FIG. 2, the wafer 10 is, for example, a circular silicon wafer having a plurality of devices 12 that are formed in respective areas on a face side 10a thereof and that are demarcated by a grid of projected dicing lines 14. The wafer 10 has a notch 16 defined in an outer circumferential edge portion at a predetermined position as a mark indicating the crystal orientation of the wafer 10. A protective tape T that is identical in shape and dimension to the wafer 10 is affixed to the face side 10a of the wafer 10 and is integrally combined with the wafer 10. The wafer 10 with the protective tape T affixed to the face side 10a thereof is turned upside down as illustrated in a lowermost section of FIG. 2, with the protective tape T facing downwardly and a reverse side 10b of the wafer 10 facing upwardly. A plurality of such wafers 10 are housed at spaced intervals in each of the first cassette 42 and the second cassette 43.

Figure 3A:
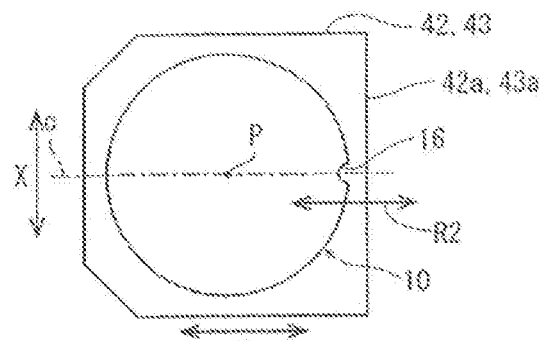
FIG. 3A is a conceptual view illustrating the manner in which an unprocessed wafer is housed in a cassette.

For processing a wafer 10 with the laser processing apparatus 1, the operator carries the first cassette 42 and the second cassette 43, each housing a plurality of unprocessed wafers 10, to the laser processing apparatus 1, and places them respectively on the cassette placing stands 41. FIG. 3A illustrates the first cassette 42 or the second cassette 43 as viewed in plan and an unprocessed wafer 10 with the notch 16 housed in the first cassette 42 or the second cassette 43. As illustrated in FIG. 3A, the notch 16 of the unprocessed wafer 10 is positioned on a center line C, i.e., an imaginary line indicated by the dot-and-dash line, extending through the center of the opening 42a in the first cassette 42 or the opening 43a in the second cassette 43 in the Y-axis direction. Stated otherwise, the direction of the notch 16 as viewed from a center P of the wafer 10 is oriented along the center line C with an angle of 0° between itself and the center line C.

After having placed the first cassette 42 and the second cassette 43 on the respective cassette placing stands 41, the operator sets laser processing conditions, etc. for a laser processing process in the laser processing apparatus 1 and instructs the laser processing apparatus 1 to start the laser processing process. When the laser processing apparatus 1 is instructed to start the laser processing process, the actuating mechanism 52, the arm mechanism 54, and the robot hand 55 of the unloading/loading mechanism 50 are actuated to attract and unload a wafer 10 from the first cassette 42, for example. The wafer 10 unloaded form the first cassette 42 is delivered to and placed on the chuck table 35 positioned in the unloading/loading position illustrated in FIG. 1. Then, the unillustrated suction means connected to the chuck table 35 is operated to hold the wafer 10 under suction on the chuck table 35. When the wafer 10 delivered by the unloading/loading mechanism 50 is placed on the chuck table 35, the wafer 10 is oriented in a fixed direction at all times.

Specifically, in the laser processing apparatus 1 according to the present embodiment, the wafer 10 delivered from the first cassette 42 is placed on the chuck table 35 while the direction of the wafer 10 remains the same as the direction of the wafer 10 housed in the first cassette 42. Therefore, the notch 16 of the wafer 10 as it is placed on the chuck table 35 is oriented in the direction of the vertical wall 261, i.e., the direction indicated by the arrow Y in FIG. 1.

Figure 4:
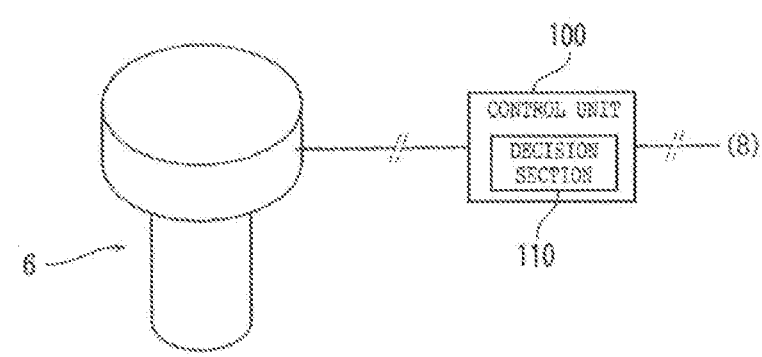
FIG. 4 is a perspective view illustrating the manner in which an image of a wafer is captured by an image capturing unit.
Figure 4:
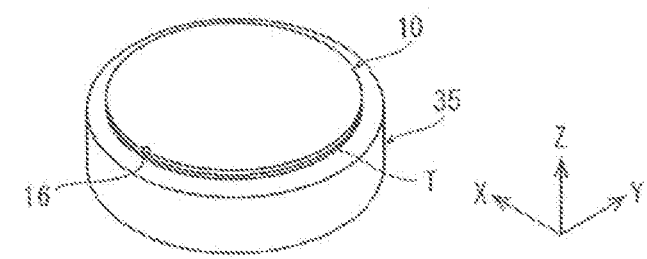

After the wafer 10 has been placed and held under suction on the chuck table 35, the feed mechanism 20 is actuated to position the chuck table 35 directly below the image capturing unit 6, as illustrated in FIG. 4. The image capturing unit 6 captures an image of the wafer 10 held under suction on the chuck table 35, and the control unit 100 performs the alignment step using the captured image. In the alignment step, the control unit 100 actuates the unillustrated rotary actuator housed in the support post 33 to rotate the chuck table 35 through 180° in one of the directions indicated by the arrow R1, in order to align the crystal orientation of the wafer 10 with a predetermined direction. The image capturing unit 6 is electrically connected to the control unit 100 and the display unit 8. In the alignment step, the position to which the beam condenser 4a of the laser beam applying unit 4 is to apply a laser beam LB and an area of the wafer 10 that is to be processed, i.e., one of the projected dicing lines 14, are aligned with each other on the basis of the captured image.

Figure 5A:
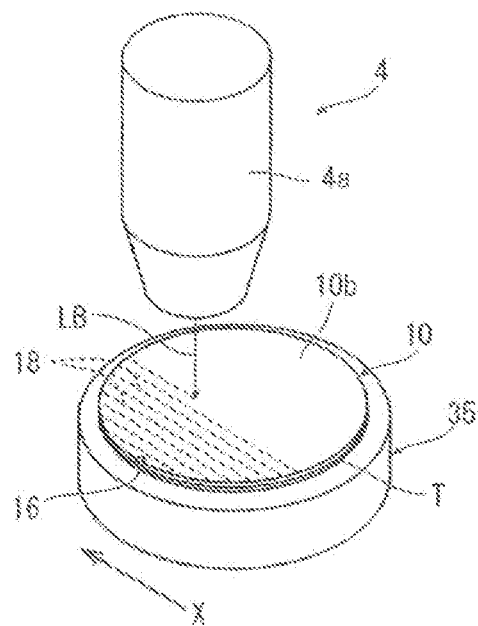
FIG. 5A is a perspective view illustrating the manner in which the wafer is processed with a laser beam.
Figure 5B:
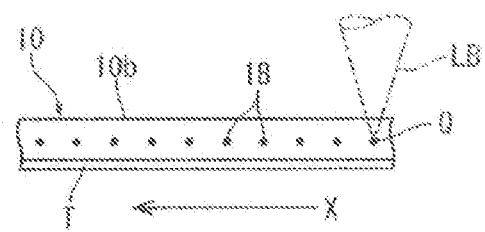
FIG. 5B is a cross-sectional view of the wafer that is being processed with the laser beam.

After the above alignment step has been carried out, a focused spot Q of the laser beam applying unit 4 is positioned within the wafer 10 below the projected dicing line 14 on the basis of positional information obtained in the alignment step, as illustrated in FIGS. 5A and 5B. Then, while the X-axis feed mechanism 21 is being actuated to processing-feed the chuck table 35 in the X-axis direction, the laser beam applying unit 4 applies the laser beam LB to the wafer 10 to form modified layers 18 in the wafer 10 along the projected dicing line 14. When the modified layers 18 have been formed in the wafer 10 along the projected dicing line 14, the Y-axis feed mechanism 22 is actuated to indexing-feed the wafer 10 in the Y-axis direction, i.e., indexing-feed direction, to align a next projected dicing line 14 with the beam condenser 4a. Then, the laser beam applying unit 4 applies the laser beam LB to the wafer 10 to form modified layers 18 in the wafer 10 along the next projected dicing line 14. In this manner, modified layers 18 are formed in the wafer 10 along all the projected dicing lines 14 that extend in a first direction. After the modified layers 18 have been formed in the wafer 10 along all the projected dicing lines 14 that extend in the first direction, the chuck table 35 is turned 90° about its central axis to align one of the projected dicing lines 14 that extend in a second direction perpendicular to the first direction with the X-axis direction. Then, the focused spot Q of the laser beam applying unit 4 is positioned within the wafer 10 below the projected dicing line 14. While the X-axis feed mechanism 21 is being actuated to processing-feed the chuck table 35 in the X-axis direction, the laser beam applying unit 4 applies the laser beam LB to the wafer 10 to form modified layers 18 in the wafer 10 along the projected dicing line 14. When the modified layers 18 have been formed in the wafer 10 along the projected dicing line 14, the Y-axis feed mechanism 22 is actuated to indexing-feed the wafer 10 in the Y-axis direction, i.e., indexing-feed direction, to align a next projected dicing line 14 with the beam condenser 4a. Then, the laser beam applying unit 4 applies the laser beam LB to the wafer 10 to form modified layers 18 in the wafer 10 along the next projected dicing line 14. The above sequence of operation is repeated to form modified layers 18 in the wafer 10 along all the projected dicing lines 14 that extend in the second direction.

After the modified layers 18 have been formed in the wafer 10 along all the projected dicing lines 14, the chuck table 35 that is holding the wafer 10 under suction thereon is brought to the unloading/loading position illustrated in FIG. 1, and then turned by the unillustrated rotary actuator housed in the support post 33 to orient the wafer 10 in the direction that the wafer 10 was oriented in when placed on the chuck table 35 before being processed with the laser beam LB. Then, the unloading/loading mechanism 50 is actuated to operate the actuating mechanism 52, the arm base 53, the arm mechanism 54, and the robot hand 55 to attract the wafer 10 under suction from the chuck table 35 and house the wafer 10 back into its position in the first cassette 42.

Figure 3B:
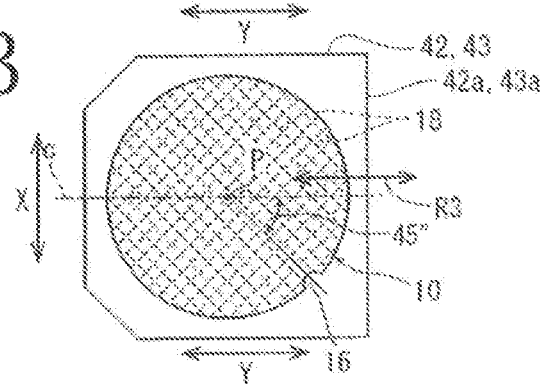
FIG. 3B is a conceptual view illustrating the manner in which a processed wafer is housed in the cassette.

The laser processing conditions according to the present embodiment may, for example, be set as follows.
Wavelength: 1342 nm
Repetitive frequency: 90 kHz
Average output power: 1.2 W
Feed speed: 700 mm/s When the processed wafer 10 is housed into the first cassette 42, the arm mechanism 54 is actuated to orient the notch 16, i.e., the mark indicating the crystal orientation of the wafer 10, defined in the processed wafer 10 in a direction illustrated in FIG. 3B, for example, that is different from the direction which is illustrated in FIG. 3A and in which the notch 16 defined in the unprocessed wafer 10 is oriented. In FIG. 3B, the modified layers 18 formed in the processed wafer 10 are represented by the dotted lines for illustrative purposes. However, the modified layers 18 formed in the processed wafer 10 are actually invisible to the naked eye and are thus difficult to confirm with the naked eye. In FIG. 3B, an imaginary line interconnecting the center P of the processed wafer 10 and the notch 16 is angularly spaced 45° clockwise from the direction in which the notch 16 defined in the unprocessed wafer 10 is oriented, i.e., the center line C extending in the Y-axis direction through the center of the opening 42a in the first cassette 42.

After the processed wafer 10 has been housed in the first cassette 42, other unprocessed wafers 10 housed in the first cassette 42 are successively unloaded from the first cassette 42, placed on the chuck table 35, and then processed with the layer beam LB, to form modified layers 18 in the wafers 10 according to the laser processing sequence described above. The processed wafers 10 are housed back into the first cassette 42 such that the imaginary line interconnecting the center P of each of the processed wafers 10 and the notch 16 is angularly spaced 45° clockwise from the center line C extending in the Y-axis direction through the center of the opening 42a in the first cassette 42.

When all the wafers 10 housed in the first cassette 42 have been processed with the laser beam LB, the notches 16 of all the wafers 10 housed in the first cassette 42 are thus positioned in the orientation angularly spaced 45° clockwise from the center line C extending in the Y-axis direction through the center of the opening 42a in the first cassette 42. According to the present embodiment, therefore, when the unloading/loading mechanism 50 houses a processed wafer 10 into a cassette, i.e., the first cassette 42 or the second cassette 43, the control unit 100 controls the unloading/loading mechanism 50 to orient the mark, i.e., the notch 16, indicating the crystal orientation of the processed wafer 10 in a predetermined direction different from the direction in which the mark or notch 16 of an unprocessed wafer 10 in the cassette, i.e., the first cassette 42 or the second cassette 43, is oriented. Accordingly, it is possible, in the laser processing apparatus 1 illustrated in FIG. 1, for example, to decide instantaneously whether or not wafers 10 housed in the first cassette 42 or the second cassette 43 have been processed. It is possible to select reliably a cassette housing processed wafers 10 and solve the problem that processed wafers 10 may be erroneously processed again by the laser processing apparatus 1.

The control unit 100 of the laser processing apparatus 1 according to the present embodiment includes the decision section 110 referred to above. The decision section 110 decides that, in a case where the mark or notch 16 indicating the crystal orientation of a wafer 10 unloaded from the first cassette 42 or the second cassette 43 by the unloading/loading mechanism 50 is oriented in a first direction on the basis of an image of the wafer 10 captured by the image capturing unit 6, the wafer 10 is an unprocessed wafer, and in a case where the mark or notch 16 is oriented in a second direction, the wafer 10 is a processed wafer. Details of the decision section 110 will be described below.

As described above, when the laser processing apparatus 1 according to the present embodiment is to process a wafer 10 with the laser beam LB, the unloading/loading mechanism 50 is actuated to unload the wafer 10 from the first cassette 42, for example, and place the wafer 10 on the chuck table 35 while orienting the wafer 10 in a predetermined direction. Specifically, the wafer 10 delivered from the first cassette 42 is placed on the chuck table 35 while the direction of the wafer 10 remains the same as the direction of the wafer 10 housed in the first cassette 42. Thereafter, for performing the alignment step, the unillustrated rotary actuator housed in the support post 33 is operated to align the crystal orientation of the wafer 10 with a predetermined direction by turning the chuck table 35 holding the wafer 10 thereon 180° in one of the directions indicated by the arrow R1. Then, the wafer 10 held on the chuck table 35 thus turned is positioned directly below the image capturing unit 6.

Figure 6A:
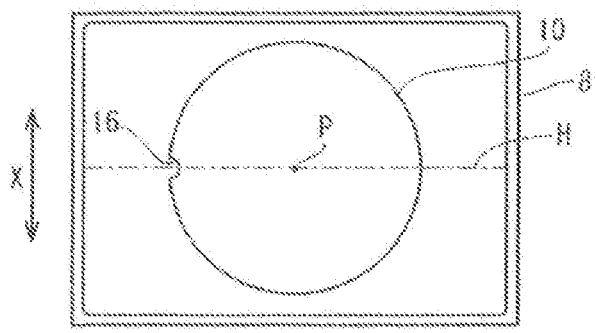
FIG. 6A is a front elevational view illustrating the manner in which an unprocessed wafer whose image has been captured by the image capturing unit is displayed on a display unit.

In a case where the wafer 10 positioned directly below the image capturing unit 6 is an unprocessed wafer, when an overall image of the wafer 10 positioned directly below the image capturing unit 6 is captured by the image capturing unit 6 and displayed on the display screen of the display unit 8, the direction of the notch 16 as viewed from the center P of the wafer 10 in the displayed image is oriented along a hairline H, i.e., in the first direction, displayed on the display screen, as illustrated in FIG. 6A. The decision section 110 of the control unit 100 analyzes the image captured by the image capturing unit 6 and displayed on the display screen to decide whether or not the direction of the notch 16 is the first direction, or more specifically, whether or not the direction of the notch 16 falls in an allowable error range, e.g., □5°, with respect to the hairline H. If the decision section 110 decides that the notch 16 is oriented in the first direction, the decision section 110 decides that the wafer 10 is unprocessed. After the decision section 110 has decided that the notch 16 is oriented in the first direction, i.e., the wafer 10 is unprocessed, the alignment step for a normal laser processing sequence is carried out, and the laser processing sequence is performed.

Figure 6B:
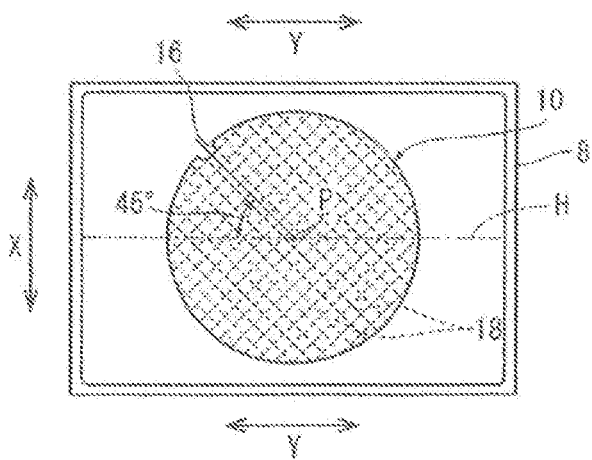
FIG. 6B is a front elevational view illustrating the manner in which a processed wafer whose image has been captured by the image capturing unit is displayed on the display unit.

On the other hand, in a case where the wafer 10 held on the chuck table 35 is a processed wafer, when an overall image of the wafer 10 is captured by the image capturing unit 6 by positioning the chuck table 35 directly below the image capturing unit 6 and displayed on the display screen of the display unit 8, the direction of the notch 16 as viewed from the center P of the wafer 10 in the displayed image is angularly spaced 45° clockwise from the hairline H, i.e., in the second direction, displayed on the display screen, as illustrated in FIG. 6B. This is because, as described above with reference to FIG. 3B, the processed wafer 10 was housed in the first cassette 42, for example, with the notch 16 being angularly spaced 45° clockwise from the center line C.

The decision section 110 decides whether or not the direction of the notch 16 of the wafer 10 positioned directly below the image capturing unit 6 is the second direction, or more specifically, whether or not the direction of the notch 16 falls in an allowable error range, e.g., 40° to 50°, with respect to the hairline H. If the decision section 110 decides that the notch 16 is oriented in the second direction, the decision section 110 decides that the wafer 10 has been processed. In a case where the decision section 110 held on the chuck table 35 has decided that the wafer 10 has been processed, since the devices 12 on the wafer 10 would be damaged if the processed wafer 10 were processed with the laser beam LB, the decision section 110 issues various warnings to let the operator know that the laser processing apparatus 1 is going to process the processed wafer 10. The warnings may be of various known types including a warning sound such as a buzzer sound, a warning message on the display unit 8, a speech sound from a speaker, a blinking red light indicative of an error, or a combination of two or more of those warning types. When the warnings are issued, the laser processing apparatus 1 is shut down in emergency to abort the laser processing sequence. The decision section 110 may issue warnings in a case where the direction of the notch 16 of the wafer 10 positioned directly below the image capturing unit 6 is neither the first direction nor the second direction. Specifically, in the case where the direction of the notch 16 is neither the first direction nor the second direction, the unloading/loading mechanism 50 may have developed operation trouble or the laser processing apparatus 1 may have suffered strong external vibrations such as from an earthquake, and the decision section 110 issues warnings for the operator and displays a message on the display unit 8 to prompt the operator to perform an operation check on the laser processing apparatus 1.

As described above, the decision section 110 of the control unit 100 may be used to decide whether the wafer 10 whose image has been captured by the image capturing unit 6 is an unprocessed wafer or a processed wafer, so that processed wafers 10 will not be processed again by the laser processing apparatus 1 and the devices 12 on the processed wafers 10 will hence be prevented from being damaged by the laser beam irregularly reflected by the already formed modified layers.

The present invention is not limited to the embodiment described above, and various changes and modifications may be made therein. According to the illustrated embodiment, the two cassettes housing processed and unprocessed wafers therein are placed on the respective cassette placing stands. The present invention is not limited to such details and may be applied to a laser processing apparatus in which one or three or more cassettes are placed on respective cassette placing stands.

According to the illustrated embodiment, processed wafers 10 and unprocessed wafers 10 are housed in a cassette such that the direction of the notches 16 of the processed wafers 10 and the direction of the notches 16 of the unprocessed wafers 10 are angularly spaced apart by 45°. The present invention is not limited to such details. Alternatively, the direction of the notches 16 of the processed wafers 10 and the direction of the notches 16 of the unprocessed wafers 10 may be angularly spaced apart by another angle such as 30°. However, if the direction of the notches 16 of the processed wafers 10 is too close to the direction of the notches 16 of the unprocessed wafers 10, then, since the operator may find it difficult to distinguish the processed wafers 10 from the unprocessed wafers 10, the direction of the notches 16 of the processed wafers 10 and the direction of the notches 16 of the unprocessed wafers 10 should preferably be angularly spaced apart by an appropriately large angle of 30° or more.

According to the illustrated embodiment, the notch 16 is illustrated as the mark indicating the crystal orientation of the wafer 10. The present invention is not limited to such details. Alternatively, any mark may be used on a wafer to indicate the crystal orientation thereof. For example, a straight surface or area such as an orientation flat formed on an outer circumferential edge portion of a wafer may be used as the mark indicating the crystal orientation of the wafer.

According to the illustrated embodiment, for delivering a processed wafer 10 to a cassette and housing the processed wafer 10 into the cassette, the arm mechanism 54 is actuated to orient the processed wafer 10 in a predetermined direction different from the direction in which an unprocessed wafer 10 is oriented in the cassette. However, the present invention is not limited to such details. For example, when a processed wafer 10 is to be unloaded from the chuck table 35, the chuck table 35 may be turned through a predetermined angle such as 45°, and the processed wafer 10 on the chuck table 35 may be attracted to the arm mechanism 54 and housed back into the cassette. In this manner, the processed wafer 10 is housed in the cassette as illustrated in FIG. 3B.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus for processing, with a laser beam, a wafer having a plurality of devices that are formed in respective areas on a face side thereof and that are demarcated by a plurality of intersecting projected dicing lines, the laser processing apparatus comprising:

a cassette placing stand for placing thereon a cassette housing a plurality of wafers;

an unloading/loading mechanism for unloading a wafer from and loading a wafer into the cassette placed on the cassette placing stand;

a chuck table for rotatably holding the wafer unloaded from the cassette by the unloading/loading mechanism;

a laser beam applying unit for applying a laser beam having a wavelength that is transmittable through the wafer held on the chuck table to the wafer while positioning a focused spot of the laser beam within the wafer below projected dicing lines to thereby form modified layers that will act as division initiating points in the wafer;

a feed mechanism for processing-feeding the chuck table and the laser beam applying unit relatively to each other;

an image capturing unit for capturing an image of the wafer; and a control unit for controlling the unloading/loading mechanism to orient a mark indicating a crystal orientation of a wafer processed by the laser beam applying unit in a predetermined direction different from a direction in which the mark of an unprocessed wafer in the cassette is oriented, when the unloading/loading mechanism houses the processed wafer into the cassette.

2. The laser processing apparatus according to claim 1, wherein the control unit includes a decision section for deciding that, in a case where the mark indicating the crystal orientation of a wafer unloaded from the cassette by the unloading/loading mechanism is oriented in a first direction on a basis of an image of the wafer captured by the image capturing unit, the wafer is an unprocessed wafer, and in a case where the mark is oriented in a second direction different from the first direction, the wafer is a processed wafer.

3. The laser processing apparatus according to claim 2, wherein the decision section issues warnings when the decision section decides that the wafer is a processed wafer.

* * * * *